(12) United States Patent
Yu

(10) Patent No.: US 6,187,664 B1
(45) Date of Patent: Feb. 13, 2001

(54) METHOD FOR FORMING A BARRIER METALLIZATION LAYER

(75) Inventor: Chen-Hua D. Yu, Keelung (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 08/498,357

(22) Filed: Jun. 5, 1995

(51) Int. Cl.⁷ .................. H01L 21/4763; H01L 21/44
(52) U.S. Cl. .................. 438/627; 438/630; 438/643; 438/649; 438/663; 438/682; 438/683
(58) Field of Search .................. 437/190, 192, 437/193, 200, 201; 148/DIG. 1; 457/926, 233

(56) References Cited

U.S. PATENT DOCUMENTS

| | | | |
|---|---|---|---|
| 4,777,150 | * 10/1988 | Deneuville et al. | 437/192 |
| 4,873,204 | * 10/1989 | Wong et al. | 437/193 |
| 4,977,098 | * 12/1990 | Yu et al. | 437/193 |
| 5,236,850 | * 8/1993 | Zhang | 437/937 |
| 5,364,803 | 11/1994 | Lun et al. | 437/40 |
| 5,451,811 | * 9/1995 | Whitten et al. | 257/530 |

FOREIGN PATENT DOCUMENTS

| | | | |
|---|---|---|---|
| 62-055949 | * 3/1987 | (JP) | 437/193 |
| 63-050042 | * 3/1988 | (JP) | 437/193 |
| 04-063414 | * 2/1992 | (JP) | 437/926 |

* cited by examiner

Primary Examiner—John F. Niebling
Assistant Examiner—Ha Tran Nguyen
(74) Attorney, Agent, or Firm—George O. Saile; Stephen B. Ackerman; Alek P. Szecsy

(57) ABSTRACT

A method for forming a barrier metallization layer upon a semiconductor substrate. A semiconductor substrate is provided which has formed upon its surface a barrier metallization layer. The barrier metallization layer has formed in-situ upon its surface a silicon layer. The silicon layer has a thickness such that the contact resistance of the barrier metallization layer is not substantially increased. In a further embodiment, the barrier metallization layer and the silicon layer are sintered to form a metal silicide layer upon the surface of the barrier metallization layer.

5 Claims, 2 Drawing Sheets

METHOD FOR FORMING A BARRIER METALLIZATION LAYER

BACKGROUND OF THE INVENTION

1. Field of the Invention

The present invention relates generally to barrier metallization layers formed upon semiconductor substrates. More particularly, the present invention relates to a low contact resistance barrier metallization layer whose surface is not susceptible to oxidation.

2. Description of Related Art

Integrated circuits are typically fabricated from semiconductor substrates upon whose surfaces are formed a multiplicity of active semiconductor regions. Within these active semiconductor regions are formed transistors, resistors, diodes and other electrical circuit elements. These circuit elements are interconnected internally and externally to the semiconductor substrate upon which they are formed through the use of conductor metallization layers which are separated by insulator layers.

As semiconductor technology has evolved, several supplementary characteristics have been found to be desirable in conductor metallization layers within integrated circuits in addition to the ability of those layers to efficient conduct electricity. Included among these supplementary characteristics are abrasion resistance characteristics, adhesive characteristics, anti-reflective characteristics and diffusional barrier characteristics.

With regard to diffusional barrier characteristics, it is often very important in advanced integrated circuit devices that conductor metallization layers not be susceptible to inhomogeneous inter-diffusion with either the semiconductor substrates with which those conductor metallization layers make contact or with adjoining conductor metallization layers with which those conductor metallization layers make contact. Inhomogeneous inter-diffusion with a semiconductor substrate may lead to formation of conductor metallization spikes into active semiconductor regions with which a conductor metallization layer makes contact. Alternatively, inhomogeneous inter-diffusion of a conductor metallization layer with an adjoining conductor metallization layer of different metallurgy composition may lead to corrosion. Since the dimensions of integrated circuit devices have continued to decrease, conductor metallization spikes and conductor metallization corrosion may readily lead to reliability and functionality concerns with advanced integrated circuits.

In order to limit inhomogeneous inter-diffusion of conductor metallization layers with silicon semiconductor substrates and adjoining conductor metallization layers with which those conductor metallization layers make contact it is common practice in the art to form a barrier metallization layer beneath and/or above a conductor metallization layer. Commonly, barrier metallization layers are formed from metals which exhibit good electrical conductivity and limited diffusivity to metals from which are formed conductor metallization layers. Metals for which it is well known that barrier metallization layers may easily be formed include titanium, tungsten, tantalum, cobalt and platinum. Of this group of metals, titanium is most commonly employed within a barrier metallization layer.

Although titanium possesses excellent characteristics with regard to inter-diffusional effects when formed as a barrier metallization layer, the use of titanium as a barrier metallization layer is not completely without problems. In particular, it is known in the art that thin titanium layers formed upon semiconductor substrates are susceptible to surface oxidation which significantly increases the contact resistance of those layers. The surface oxidation characteristics of titanium metallization layers are very important in situations where integrated circuit processing schemes require those titanium metallization layers to be exposed to an oxygen atmosphere immediately after they are formed. Such will be the case, for example, when the semiconductor processing operation immediately succeeding the formation of a titanium barrier metallization layer is of necessity not undertaken in the same reaction chamber which was used to deposit the titanium barrier metallization layer. It is thus an object of the present invention to provide a method for passivating titanium barrier metallization layers, and other barrier metallization layers which are susceptible to surface oxidation, so that semiconductor substrates upon which are formed those barrier metallization layers may be readily transferred through oxygen containing atmospheres for subsequent integrated circuit processing operations.

Methods by which thin conducting films formed upon semiconductor substrates may be modified to limit diffusional and oxidative effects are known in the art. For example, Lur et al. in U.S. Pat. No. 5,364,803 discloses a thin conducting layer which inhibits diffusion of fluorine atoms from a tungsten silicide layer of a polycide gate structure.

Desirable in the art is a method whereby surfaces of barrier metallization layers which are susceptible to oxidation may be readily and effectively passivated. Such passivation will allow for efficient transfer through oxygen containing atmospheres of semiconductor substrates upon whose surfaces reside those barrier metallization layers.

SUMMARY OF THE INVENTION

A first object of the present invention is to provide a method whereby surfaces of barrier metallization layers which are susceptible to oxidation may be efficiently passivated to allow transfer through oxygen containing atmospheres of semiconductor substrates upon whose surfaces reside those barrier metallization layers.

A second object of the present invention, is to provide a method in accord with the first object of the present invention, which method is also readily manufacturable.

A third object of the present invention is to provide a method in accord with the first object and the second object of the present invention, which method is also economical.

In accord with the objects of the present invention, a new method for passivating a barrier metallization layer whose surface is susceptible to oxidation is provided. The method begins by providing a semiconductor substrate upon whose surface resides a barrier metallization layer whose surface is susceptible to oxidation. Upon the surface of the barrier metallization layer is then formed a silicon layer, the silicon layer having a thickness such that the contact resistance of the barrier metallization layer is not substantially increased. As a further embodiment applicable to barrier metals which are susceptible to formation of a metal silicide, the barrier metallization layer and the silicon layer may then be sintered until the silicon layer is completely consumed and a metal silicide layer is formed upon the surface of the barrier metallization layer.

The method of the present invention provides an effective passivation layer for the surface of the barrier metallization layer, thus allowing a semiconductor substrate upon whose surface resides the barrier metallization layer to be transferred through an oxygen containing environment without oxidation of the barrier metallization layer. The silicon layer which is formed upon the surface of the barrier metallization layer provides an effective barrier to the passage of oxygen which would oxidize the barrier metallization layer. Whereas the oxide which might otherwise form upon the barrier metallization layer is a thicker and insulating oxide which provides increased contact resistance of barrier metals upon which such oxides form, the silicon layer of the present invention is a thin layer which does not substantially increase the contact resistance of the barrier metallization layer. In addition, the silicon layer of the present layer may optionally be sintered with the barrier metallization layer of the present invention to form a metal silicide layer. The metal silicide layer so formed also provides a low contact resistance layer which is not susceptible to oxidation.

The method of the present invention is readily manufacturable. The method of the present invention requires only the additional processing step of providing a thin silicon layer upon the surface of the barrier metallization layer. Optionally, the present invention may also provide a thermal treatment process to sinter the silicon layer and the barrier metallization layer upon which the silicon layer resides. Each of these additional process steps may be readily accomplished within the same reaction chamber within which the barrier metallization layer of the present invention is formed upon a semiconductor substrate.

The method of the present invention is economical. Neither the materials cost nor the processing time associated with forming a silicon layer upon the surface of a barrier metallization layer is substantial in comparison with the materials and processing costs associated with the remaining materials and processing of an integrated circuit. The costs associated with a thermal process to sinter the silicon layer and the barrier metallization layer may also be insubstantial.

BRIEF DESCRIPTION OF THE DRAWINGS

The accompanying drawings, which form a material part of this disclosure, show the following.

DESCRIPTION OF THE PREFERRED EMBODIMENTS

The present invention provides an improved method for forming a barrier metallization layer upon the surface of a semiconductor substrate. The surface of the barrier metallization layer of the present invention is not susceptible to oxidation when the barrier metallization layer of the present invention is exposed to an oxygen atmosphere. The oxidation of a barrier metallization layer through exposure to oxygen may cause an increase in contact resistance of the barrier metallization layer. The surface of the barrier metallization layer of the present invention is coated in-situ with a thin silicon layer prior to removing from the reaction chamber within which the barrier metallization layer of the present invention was coated the semiconductor substrate upon which the barrier metallization layer was coated. The thin silicon layer provides passivation which inhibits oxidation of the surface of the barrier metallization layer of the present invention. In a further embodiment of the present invention, the silicon layer is sintered with the barrier metallization layer to form a metal silicide which also serves as a passivating layer and maintains a low contact resistance to the underlying barrier metallization layer of the present invention.

The barrier metallization layer of the present invention may be formed at any metallization level within an integrated circuit wherein: (1) a barrier metallization layer is desired or required, (2) the barrier metallization is formed from a metal which is susceptible to oxidation in an oxygen atmosphere, which oxidation yields an increase in contact resistance, and (3) the semiconductor substrate upon which the barrier metallization resides must be exposed to an oxygen atmosphere prior to the next processing step to which the semiconductor substrate is exposed. The barrier metallization layer of the present invention may be incorporated into the semiconductor substrate contact metallurgy of an integrated circuit, or the barrier metallization layer of the present invention may be incorporated into any of the multiple connecting metallization layers or conductor metallization layers which lie above the contact metallurgy. The barrier metallization layer of the present invention has broad applicability within metallization layers of integrated circuits.

The barrier metallization layer of the present invention also has broad applicability within various types of integrated circuits. The barrier metallization layer of the present invention may be incorporated into integrated circuits including but not limited to Static Random Access Memory (SRAM) integrated circuits, Dynamic Random Access Memory (DRAM) integrated circuits, Application Specific Integrated Circuits (ASICs), integrated circuits which are formed from field effect transistors and integrated circuits which are formed from bipolar transistors.

Figure 1A:
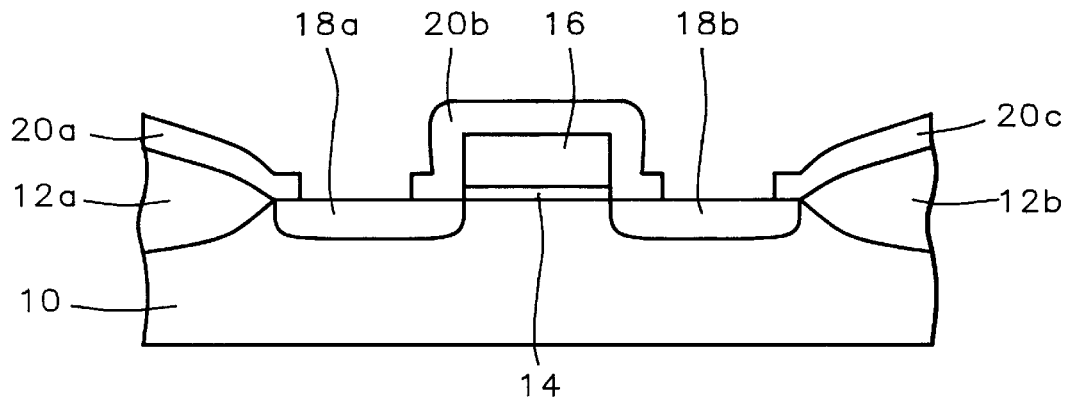
FIG. 1a to FIG. 1c show a series of cross-sectional schematic diagrams which illustrate a semiconductor substrate upon whose surface is formed a barrier metallization layer in accord with the preferred embodiments of the present invention.
Figure 1B:
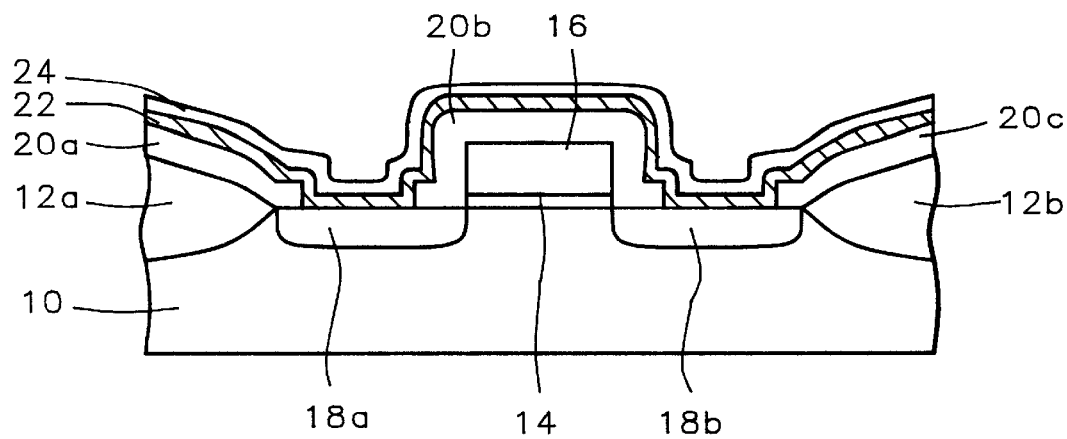
Figure 1C:
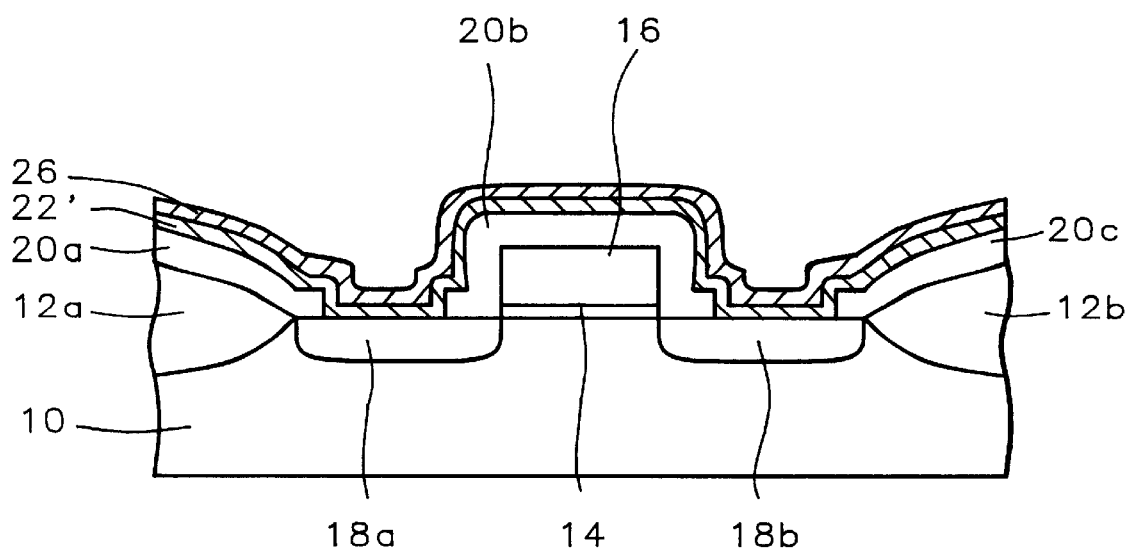

Referring now to FIG. 1a to FIG. 1c there is shown a series of schematic cross-sectional diagrams which illustrate a field effect transistor structure into which is incorporated the barrier metallization layer of the present invention. Referring specifically to FIG. 1a there is shown a semiconductor substrate 10 within and upon which are formed isolation regions 12a and 12b. Between isolation regions 12a and 12b resides the active semiconductor region of the semiconductor substrate 10.

Methods by which isolation regions may be formed within and upon semiconductor substrates are known in the art. Such methods include but are not limited to: (1) methods whereby portions of a semiconductor substrate exposed through a suitable oxidation mask are thermally oxidized to form isolation regions, and (2) methods whereby a blanket insulating layer is formed upon the surface of a semiconductor substrate and patterned to form isolation regions. For the preferred embodiment of the present invention, the isolation regions 12a and 12b are preferably formed through thermal oxidation of portions of the semiconductor substrate 10 exposed through a suitable oxidation mask.

Subsequent to forming the isolation regions 12a and 12b within the semiconductor substrate 10, there is formed upon the surface of the active region a gate electrode 16 which resides upon a gate oxide 14. Methods for forming gate electrodes and gate oxides are conventional to the art of field effect transistor fabrication. Gate oxides may be formed by patterning blanket layers of gate oxide material through photolithographic and etching methods as are conventional in the art. Blanket layers of gate oxide material may be formed upon the surfaces of active semiconductor regions through processes including but not limited to thermal oxidation processes through which the surface of the active semiconductor region is oxidized to form a blanket gate oxide layer and thin film deposition processes whereby a blanket gate oxide layer is formed upon the surface of the active semiconductor region through chemical, physical or physicochemical deposition means.

Methods and materials for forming gate electrodes are also well known in the art. Gate electrodes are typically formed from highly conducting materials such as metals, metal alloys, highly doped polysilicon, and polycides (polysilicon/metal silicide stacks). Gate electrodes are typically formed through patterning of a blanket layer of gate electrode material formed upon the blanket gate oxide layer through methods including but not limited to thermal evaporation methods, Chemical Vapor Deposition (CVD) methods and Physical Vapor Deposition sputtering methods. The gate oxide is then typically patterned using as a mask the gate electrode.

For the preferred embodiments of the present invention, the gate oxide 14 is preferably formed through patterning of a blanket layer of gate oxide material formed through thermal oxidation of the surface of the active semiconductor region. The thickness of the gate oxide is preferably about 20 to about 300 angstroms. The gate electrode 16 is used as the mask to pattern the gate oxide 14.

For the preferred embodiments of the present invention, the gate electrode 16 is preferably formed through patterning of a blanket layer of highly doped polysilicon formed upon the semiconductor substrate through either: (1) a Chemical Vapor Deposition (CVD) process employing either silane or disilane as the silicon source material, or (2) a Physical Vapor Deposition (PVD) sputtering process. The thickness of the blanket layer of highly doped polysilicon is typically about 500 to about 5000 angstroms. Doping of the blanket polysilicon layer may in general be accomplished through methods including but not limited to co-deposition of dopant atoms along with the silicon source material from which is formed the blanket polysilicon layer, and ion implantation of dopant atoms subsequent to forming the blanket polysilicon layer.

For the preferred embodiments of the present invention, the dopant atoms are preferably incorporated into the blanket polysilicon layer after it is formed through either an ion implantation process or a thermal diffusion process. Although various dopant atoms may be used, including but not limited to arsenic atoms, boron atoms, boron difluoride atoms and phosphorus atoms, the preferred dopant for the blanket polysilicon layer from which is formed the gate electrode of the preferred embodiments of the present invention is arsenic. Typical conditions for arsenic doping provided through an ion implantation process include an ion implantation dose of about 5E15 to about 5E16 ions per square centimeter dose and an ion implantation energy of about 20 to about 200 keV.

After the gate oxide 14 and the gate electrode 16 have been formed upon the surface of the active semiconductor region, the source/drain electrodes 18a and 18b are formed into the active semiconductor region of semiconductor substrate 10 at areas not occupied by the gate electrode 16 and the gate oxide 14. Methods and materials through which source/drain electrodes may be formed within surfaces of active semiconductor regions are well known in the art. Such methods include but are not limited to ion implantation methods whereby dopant atoms such as arsenic, boron, boron difluoride and phosphorus are ionized and accelerated into the surface of the active semiconductor region. For the preferred embodiment of the present invention, source/drain electrodes 18a and 18b may be formed of either polarity through ion implantation of arsenic, phosphorus or boron difluoride ions into the active semiconductor region at about 1E15 to about 9E16 ions per square centimeter ion implantation dose and about 5 to about 100 keV ion implantation energy.

Finally, there is shown in FIG. 1a the presence of patterned insulating layers 20a, 20b and 20c. Methods and materials through which patterned insulating layers may be formed upon semiconductor substrates are known in art. Patterned insulating layers are typically formed through patterning of blanket insulating layers using photolithographic and etching methods as are common in the art. Blanket insulating layers are typically formed from materials including but not limited to oxide materials, nitride materials and oxynitride materials. These blanket insulating layers may be formed upon semiconductor substrates through methods including but not limited to Physical Vapor Deposition (PVD) methods, Chemical Vapor Deposition (CVD) methods and Plasma Enhanced Chemical Vapor Deposition (PECVD) methods.

For the preferred embodiments of the present invention, the patterned insulating layers 20a, 20b and 20c are preferably formed from a blanket layer of silicon oxide formed upon the surface of the semiconductor substrate 10 through a Chemical Vapor Deposition (CVD) process employing either Tetra Ethyl Ortho Silicate (TEOS) or silane as the silicon source material. The blanket insulating layer is then patterned through a photoresist etch mask, preferably through a dry etching process employing an etch gas composition containing carbon tetra-fluoride and tri-fluoro methane, to yield the patterned insulating layers 20a, 20b and 20c. The patterned insulating layers 20a, 20b and 20c are preferably about 4000 to about 20000 angstroms thick.

Having formed upon the semiconductor substrate 10 the field effect transistor structure as illustrated in FIG. 1a, the critical process steps in forming the barrier metallization layer of the present invention may proceed. The results of those critical process steps are illustrated in FIG. 1b. FIG. 1b illustrates the presence of a barrier metallization layer 22 formed upon the surface of the semiconductor substrate 10 illustrated in FIG. 1a. Also shown in FIG. 1b is the presence of a silicon layer 24 formed upon the barrier metallization layer 22.

The critical features of the barrier metallization layer 22 and the silicon layer 24 of the preferred embodiment of the present invention are: (1) the barrier metallization layer 22 is susceptible to oxidation when it is exposed to an oxygen atmosphere, the oxidation yielding a substantial increase in contact resistance of the barrier metallization layer 22, and (2) the silicon layer 24 is formed in-situ upon the barrier metallization layer 22 and the silicon layer 24 has a thickness such that the contact resistance of the barrier metallization layer 22 is not substantially increased.

Methods and materials through which barrier metallization layers may be formed upon the surfaces of semiconductor substrates are known in the art. Metals through which barrier metallization layers may be formed, which metals are susceptible to oxidation when exposed to an oxygen atmosphere, include but are not limited to titanium and cobalt. These metals may be formed upon semiconductor substrates through methods including but not limited to Chemical Vapor Deposition (CVD) methods, Plasma Enhanced Chemical Vapor Deposition (PECVD) methods and Physical Vapor Deposition (PVD) sputtering methods. It is critical to the present invention that the equipment used to deposit upon the semiconductor substrate 10 the barrier metallization layer 22 also be adaptable to form in-situ upon the barrier metallization layer 22 the silicon layer 24.

For the preferred embodiment of the present invention, the barrier metallization layer 22 is preferably formed from titanium. The barrier metallization layer 22 is preferably formed upon the surface of the semiconductor substrate 10 at a thickness of about 100 to about 1000 angstroms. The barrier metallization layer 22 is also preferably formed upon the surface of the semiconductor substrate through a Physical Vapor Deposition (PVD) sputtering process.

Once the barrier metallization layer 22 has been formed upon the surface of the semiconductor substrate 10, the silicon layer 24 may be formed upon the surface of the barrier metallization layer 22. There are several methods through which various types of silicon layers may be formed upon surfaces of semiconductor substrates. Types of silicon layers which may be formed upon semiconductor substrates include but not limited to amorphous silicon layers, crystalline silicon layers and polycrystalline silicon layers. Such silicon layers may be formed upon semiconductor substrates through methods including but not limited to Chemical Vapor Deposition (CVD) methods, Plasma Enhanced Chemical Vapor Deposition (PECVD) methods and Physical Vapor Deposition (PVD) sputtering methods.

For the preferred embodiments of the present invention, it is preferred that the silicon layer 24 which is formed upon the barrier metallization layer 24 be formed from an amorphous silicon material. Preferably, th e amorphous silicon material is formed into the silicon layer 24 upon the surface of the barrier metallization layer 22 through either: (1) a Plasma Enhanced Chemical Vapor Deposition (PECVD) process employing either silane or disilane as the silicon source material, or (2) a Physical Vapor Deposition (PVD) sputtering process employing either an amorphous silicon or a polycrystalline silicon target source. When the silicon layer 24 is formed from amorphous silicon, it has been found that the silicon layer is preferably from about 50 to about 500 angstroms thick in order to adequately protect the barrier metallization layer 24 from oxidation and simultaneously not substantially increase the contact resistance of the barrier metallization layer 24.

Once the silicon layer 24 is formed upon the surface of the barrier metallization layer 22 of the present invention, the semiconductor substrate 10 upon which resides the barrier metallization layer 22 and the silicon layer 24 may be exposed to an oxygen atmosphere. Under these circumstances, a thick oxide will not form upon the surface of the barrier metallization layer 22, which thick oxide will increase the contact resistance of the barrier metallization layer 22.

As a further embodiment of the preferred embodiment of the present invention, it is also possible to sinter the barrier metallization layer 22 and the silicon layer 24 to form a metal silicide upon the surface of the barrier metallization layer 22. The results of such a process are illustrated in FIG. 1c. FIG. 1c follows from FIG. 1b. The upper portion of the barrier metallization layer 22 of FIG. 1b is consumed during the sintering process to form the barrier metallization layer 22' of FIG. 1c. The silicon layer 24 of FIG. 1b is preferably completely consumed to form the metal silicide layer 26 of FIG. 1c.

There are several methods through which barrier metallization layers and silicon layers residing upon those barrier metallization layers may be sintered to partially consume the barrier metallization layer and completely consume the silicon layer while forming a metal suicide layer. Methods include but are not limited to conventional thermal sintering methods, Rapid Thermal Processing (RTP) methods employing intense rapid heating, and optical processing methods employing conventional and laser light sources.

For the further embodiment of the preferred embodiment of the present invention, it is preferred that the barrier metallization layer 22 is sintered with the silicon layer 24 through a Rapid Thermal Processing (RTP) method. It is further preferred that the Rapid Thermal Processing (RTP) method be incorporated in-situ into the processing chamber within which the barrier metallization layer 22 and the silicon layer 24 are formed upon the surface of the semiconductor substrate 10. For the further embodiment of the preferred embodiment of the present invention, the sintering is preferably undertaken at about 600 to about 900 degrees centigrade.

It is not critical that the sintering of the barrier metallization layer 22 and the silicon layer 24 be undertaken immediately after the silicon layer 24 is formed upon the barrier metallization layer 22. Additional layers may be formed upon the silicon layer 24 prior to exposing the barrier metallization layer 22 and the silicon layer 24 to a sintering process.

Upon completion of the sintering to form the barrier metallization layer 22' and the metal silicide layer 26, there is formed a semiconductor substrate having upon its surface a barrier metallization layer 22' which is not susceptible to oxidation. The semiconductor substrate 10 upon which resides the barrier metallization layer 22' of the further embodiment of the preferred embodiment of the present invention may be exposed to an oxygen atmosphere without formation of an oxide layer which would increase the contact resistance of the barrier metallization layer 22'.

What is claimed is:

1. A method for forming a barrier metallization layer upon a semiconductor substrate comprising:

providing a semiconductor substrate;

forming upon the semiconductor substrate a barrier metallization layer; and forming in-situ upon the barrier metallization layer a silicon layer, the silicon layer being formed without exposing the barrier metallization layer to oxygen, the silicon layer having a thickness such that the contact resistance of the barrier metallization layer is not substantially increased;

wherein the barrier metallization layer is formed at a thickness of about 100 to about 1000 angstroms.

2. A method for forming a barrier metallization layer upon a semiconductor substrate comprising:

providing a semiconductor substrate;

forming upon the semiconductor substrate a barrier metallization layer; and forming in-situ upon the barrier metallization layer a silicon layer, the silicon layer being formed without exposing the barrier metallization layer to oxygen, the silicon layer having a thickness such that the contact resistance of the barrier metallization layer is not substantially increased;

wherein the silicon layer is formed from an amorphous silicon material;

wherein the amorphous silicon material is formed upon the surface of the barrier metallization layer at a thickness of about 50 to about 500 angstroms.

3. A method for forming a barrier metallization layer upon a semiconductor substrate comprising:

providing a semiconductor substrate;

forming upon the semiconductor substrate a barrier metallization layer; and forming in-situ upon the barrier metallization layer a silicon layer, the silicon layer being formed without exposing the barrier metallization layer to oxygen, the silicon layer having a thickness such that the contact resistance of the barrier metallization layer is not substantially increased;

sintering the silicon layer and the barrier metallization layer to form a silicide layer upon the surface of the barrier metallization layer;

wherein the sintering of the silicon layer and the barrier metallization layer is undertaken at about 600 to about 900 degrees centigrade.

4. A method for forming a titanium barrier metallization layer upon a semiconductor substrate comprising:

providing a semiconductor substrate;

forming a titanium barrier metallization layer upon the semiconductor; and forming in-situ upon the titanium barrier metallization layer a silicon layer, the silicon layer being formed without exposing the titanium barrier metallization layer to oxygen, the silicon layer being of a thickness such that the contact resistance of the titanium barrier metallization layer is not substantially increased;

wherein the titanium barrier metallization layer is formed upon the surface of the semiconductor substrate through a Physical Vapor Deposition (PVD) sputtering process to yield a titanium barrier metallization layer of thickness of about 100 to about 1000 angstroms.

5. A method for forming a titanium barrier metallization layer upon a semiconductor substrate comprising:

providing a semiconductor substrate;

forming a titanium barrier metallization layer upon the semiconductor; and forming in-situ upon the titanium barrier metallization layer a silicon layer, the silicon layer being formed without exposing the titanium barrier metallization layer to oxygen, the silicon layer being of a thickness such that the contact resistance of the titanium barrier metallization layer is not substantially increased;

wherein the silicon layer is formed from an amorphous silicon material formed upon the surface of the barrier metallization layer at a thickness of about 50 to about 500 angstroms.

* * * * *